United States Patent
Kumar et al.

(10) Patent No.: US 9,318,601 B2
(45) Date of Patent: Apr. 19, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Manoj Kumar, Dhanbad (IN); Pei-Heng Hung, New Taipei (TW); Priyono Tri Sulistyanto, Yogyakarta (ID); Chia-Hao Lee, New Taipei (TW); Chih-Cherng Liao, Jhudong Township (TW); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/300,990

(22) Filed: Jun. 10, 2014

(65) Prior Publication Data

US 2015/0357466 A1  Dec. 10, 2015

(51) Int. Cl.
*H01L 29/78* (2006.01)
*H01L 29/06* (2006.01)
*H01L 29/66* (2006.01)
*H01L 21/265* (2006.01)
*H01L 29/10* (2006.01)

(52) U.S. Cl.
CPC ...... *H01L 29/7817* (2013.01); *H01L 21/26513* (2013.01); *H01L 29/0634* (2013.01); *H01L 29/1095* (2013.01); *H01L 29/66681* (2013.01)

(58) Field of Classification Search
None
See application file for complete search history.

(56) References Cited

U.S. PATENT DOCUMENTS

| 5,869,875 A * | 2/1999 | Hebert ........................... 257/382 |
| 7,061,057 B2 * | 6/2006 | Babcock et al. .............. 257/401 |
| 2003/0190789 A1 * | 10/2003 | Salama ............... H01L 29/0634 438/286 |
| 2012/0280317 A1 * | 11/2012 | Lee ..................... H01L 29/0634 257/335 |
| 2013/0082326 A1 * | 4/2013 | Tang ............................. 257/335 |

* cited by examiner

*Primary Examiner* — Charles Garber
*Assistant Examiner* — Alia Sabur
(74) *Attorney, Agent, or Firm* — Birch, Stewart, Kolasch & Birch, LLP

(57) ABSTRACT

A semiconductor device includes a semiconductor substrate and a semiconductor layer formed thereover. A gate structure is disposed over the semiconductor layer, and a first doped region is disposed in the semiconductor layer adjacent to a first side of the gate structure. A second doped region is disposed in the semiconductor layer adjacent to a second side of the gate structure opposite to the first side. A third doped region is disposed in the first doped region. A fourth doped region is disposed in the second doped region. A plurality of fifth doped regions is disposed in the second doped region. A sixth doped region is disposed in the semiconductor layer under the first doped region. A conductive contact is formed in the third doped region and the first doped region.

16 Claims, 18 Drawing Sheets

SEMICONDUCTOR DEVICE AND METHOD FOR FABRICATING THE SAME

BACKGROUND OF THE INVENTION

1. Field of the Invention

The present invention relates to integrated circuit (IC) devices, and in particular to a semiconductor device and a method for fabricating the same.

2. Description of the Related Art

Recently, due to the rapid development of communication devices such as mobile communication devices and personal communication devices, wireless communication products such as mobile phones and base stations have been greatly developed. In wireless communication products, high-voltage elements of lateral double diffused metal-oxide-semiconductor (LDMOS) devices are often used as radio frequency (RF, 900 MHz-2.4 GHz) related elements therein.

LDMOS devices not only have a higher operating frequency, but they are also capable of sustaining a higher breakdown voltage, thereby having a high output power so that they can be used as power amplifiers in wireless communication products. In addition, due to the fact that LDMOS devices can be formed by conventional CMOS fabrication processes, LDMOS devices can be fabricated from a silicon substrate which is relatively cost-effective and employs mature fabrication techniques.

For RF applications, the LDMOS devices require low gate to drain capacitance to enhance the maximum operating frequency thereof. In addition, the LDMOS devices also require low source to drain resistance (Ron). However, to get low Ron, the drift region and the gate interface of the LDMOS devices need to be increased, which will increase the gate to drain capacitance. Therefore, improved LDMOS devices with both low gate to drain capacitance and low source to drain resistance (Ron) are desired.

BRIEF SUMMARY OF THE INVENTION

An exemplary semiconductor device comprises a semiconductor substrate, a semiconductor layer, a gate structure, a first doped region, a second doped region, a third doped region, a fourth doped region, a plurality of fifth doped regions, a sixth doped region, and a conductive contact. The semiconductor substrate has a first conductivity type, and the semiconductor layer is formed over the semiconductor substrate, having the first conductivity type. The gate structure is disposed over a portion of the semiconductor layer, and a first doped region is disposed in a portion of the semiconductor layer adjacent to a first side of the gate structure, having the first conductivity type. The second doped region is disposed in a portion of the semiconductor layer adjacent to a second side of the gate structure opposite to the first side, having a second conductivity type opposite to the first conductivity type. A third doped region is disposed in a portion of the first doped region, having the second conductivity type. A fourth doped region is disposed in a portion of the second doped region, having the second conductivity type. A plurality of fifth doped regions are separately disposed in a plurality portions of the second doped region, having the first conductivity type, wherein the fifth doped regions are formed between the fourth doped region and the gate structure. A sixth doped region is disposed in a portion of the semiconductor layer under the first doped region, contacting the semiconductor substrate. A conductive contact is formed in a portion of the third doped region and the first doped region, contacting the sixth doped region.

An exemplary method for fabricating a semiconductor device comprises providing a semiconductor substrate, having a first conductivity type. A semiconductor layer is formed over the semiconductor substrate, having the first conductivity type. A gate structure is formed over a portion of the semiconductor layer. A first doped region is formed in a portion of the semiconductor layer adjacent to a first side of the gate structure, having the first conductivity type. A second doped region is formed in a portion of the semiconductor layer adjacent to a second side of the gate structure opposite to the first side, having a second conductivity type opposite to the first conductivity type. A third doped region is formed in a portion of the first doped region, having the second conductivity type. A fourth doped region is formed in a portion of the second doped region, having the second conductivity type opposite to the first conductivity type. A plurality of fifth doped regions are formed in a plurality portions of the second doped region, having the first conductivity type, wherein the fifth doped regions are formed between the fourth doped region and the gate structure. An insulating layer is formed over the second doped region, the gate structure, and a portion of the third doped region. A trench is formed in a portion of the third doped region and the first doped region, exposing a portion of the semiconductor layer under the first doped region. An ion implantation process is performed to implant dopants of the first conductive type in the semiconductor layer exposed by the trench, thereby forming a sixth doped region, wherein the sixth doping region physically contacts with the semiconductor substrate. A conductive contact is formed in the trench, wherein the conductive contact physically contacts with the sixth doped region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-26 are schematic diagrams showing an exemplary method for fabricating a semiconductor device, wherein FIGS. 1, 3, 6, 9, 12, 15, 18, 21, and 24 are schematic top views, and FIGS. 2, 4-5, 7-8, 10-11, 13-14, 16-17, 19-20, 22-23, and 25-26 are schematic cross sectional views along lines 2-2, 4-4, 5-5, 7-7, 8-8, 10-10, 11-11, 13-13, 14-14, 16-16, 17-17, 19-19, 20-20, 22-22, 23-23, 25-25, and 26-26 in FIGS. 1, 3, 6, 9, 12, 15, 18, 21, and 24, respectively, showing the intermediate fabrication steps in the method for fabricating the semiconductor device. The semiconductor device formed by the exemplary method shown in FIGS. 1-26 is applicable as a lateral double diffused metal-oxide-semiconductor (LDMOS) device used as radio frequency (RF) circuit elements.

Figure 1:
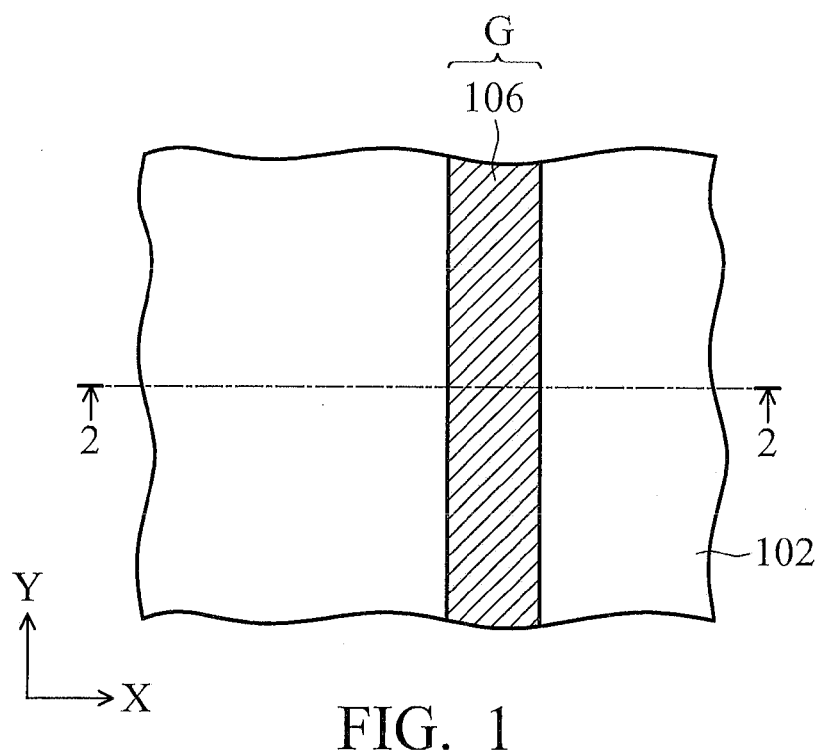
FIGS. 1, 3, 6, 9, 12, 15, 18, 21, and 24 are schematic top views showing a method for fabricating a semiconductor device according to an embodiment of the invention.
Figure 2:
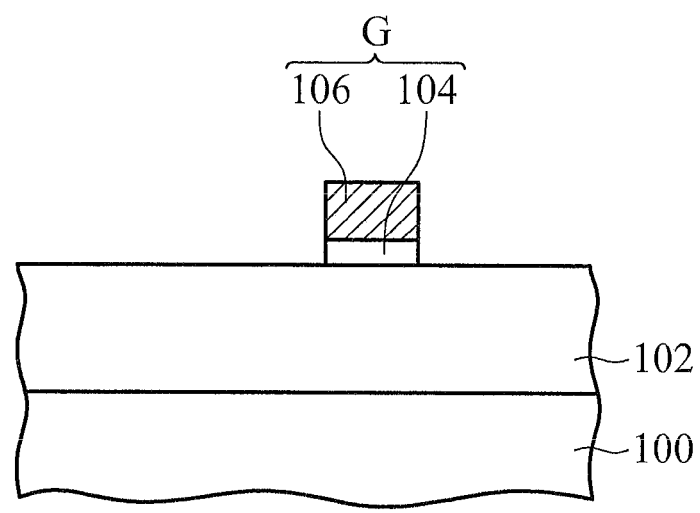
FIG. 2 is a schematic cross-sectional view showing a cross section along the line 2-2 in FIG. 1.

Referring to FIGS. 1-2, a semiconductor substrate 100 such as a silicon substrate is first provided. In one embodiment, the semiconductor substrate 100 has a first conductivity type, such as P type, and a resistivity of about 1E-3 ohms-cm (Ω-cm) to about 10E-3 ohms-cm (Ω-cm). A semiconductor layer 102, for example a silicon layer, is then formed over the semiconductor substrate 100 by a method such as an epitaxial growth method. The semiconductor layer 102 can be in-situ doped with dopants of the first conductivity type, such as P type, during the formation thereof, and has a resistivity of about 0.2-0.9 ohms-cm (Ω-cm). In one embodiment, the resistivity of the semiconductor layer 102 is greater than that of the semiconductor substrate 100.

Next, a patterned gate structure G is formed over a portion of the semiconductor layer 102 along a direction, for example the Y direction in FIG. 1. The gate structure G mainly comprises a gate dielectric layer 104 and a gate electrode 106 sequentially formed over a portion of the semiconductor layer 102. The gate dielectric layer 104 and the gate electrode 106 of the gate structure G can be formed by conventional gate processes, and are not described here in detail for the purpose of simplicity. In one embodiment, the gate dielectric layer 104 may comprise dielectric materials such as silicon oxide, and the gate electrode 206 may comprise conductive materials such as polysilicon or a combination of polysilicon with other materials such as metal or silicide.

Figure 3:
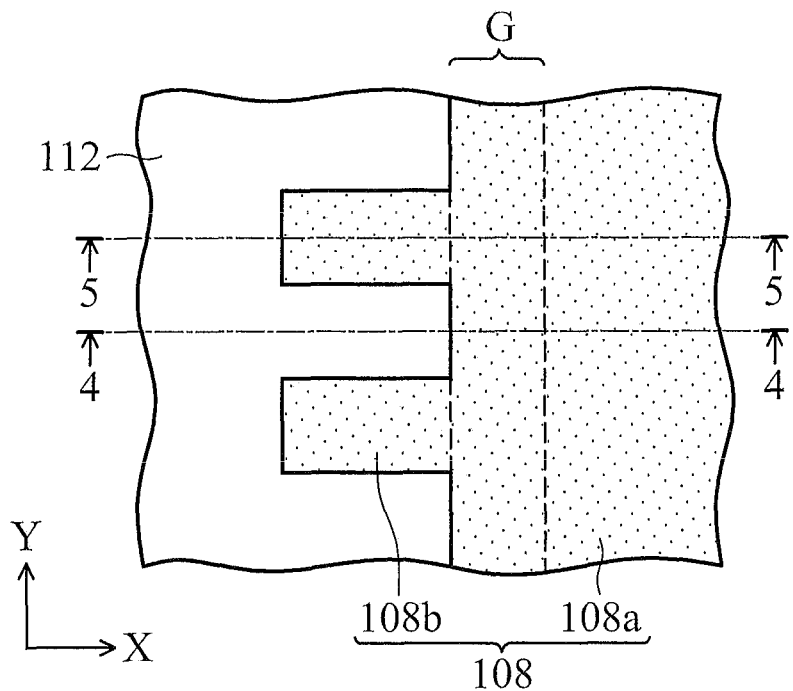
Figure 4:
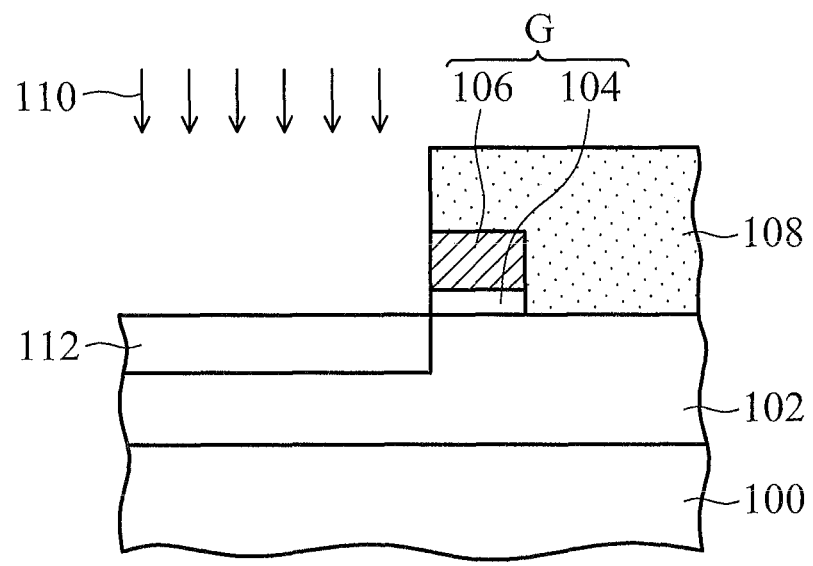
FIG. 4 is a schematic cross-sectional view showing a cross section along the line 4-4 in FIG. 3.
Figure 5:
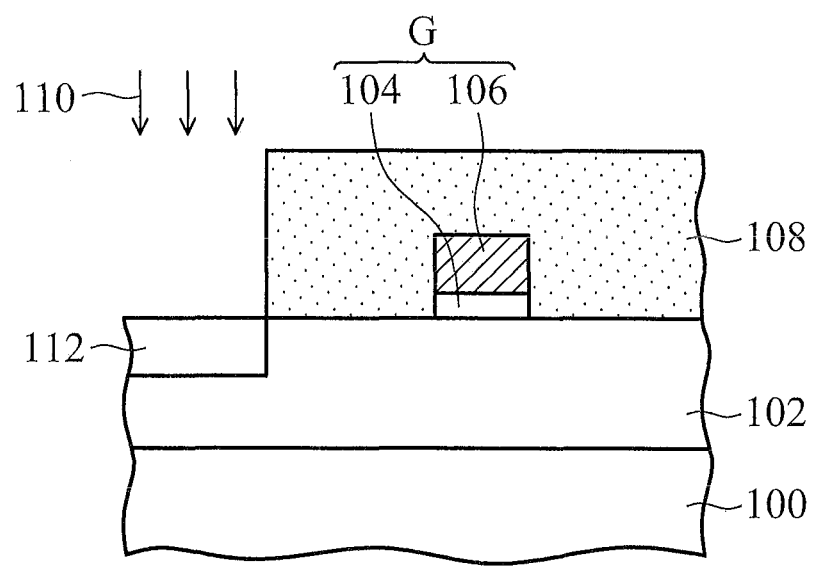
FIG. 5 is a schematic cross-sectional view showing a cross section along the line 5-5 in FIG. 3.

Referring to FIGS. 3-5, a patterned mask layer 108 is formed over the semiconductor layer 102, and an ion implant process 110 is then performed to form a doped region 112 in a portion of the semiconductor layer 102 at a side, for example the left side, of the gate structure G.

As shown in FIGS. 3-5, the patterned mask layer 108 comprises a bulk portion 108a and a plurality of protrusion portions 108b connected thereto. The bulk portion 108a of the patterned mask layer 108 covers the gate structure G and the portion of the semiconductor layer 102 at the right side of the gate structure G. The protrusion portions 108b connected to the bulk portion 108a are formed with a strip-like pattern, from a top view, and are separately formed over a plurality portions of the semiconductor layer 102 adjacent to the left side of the gate structure G. The protrusion portions 108b extend along a direction, for example the x direction in FIG. 3, which is perpendicular to the direction of the gate structure G. In one embodiment, the patterned mask layer 108 may comprise materials such as a photoresist, such that the patterned mask layer 108 can be patterned by, for example, photolithography and etching processes (both not shown).

In addition, in the ion implant process 110, dopants of a second conductivity type, for example an N-type, opposite to the first conductivity are implanted into the portions of the semiconductor layer 102 exposed by the patterned mask layer 108, thereby forming the doped region 112 having the second conductivity type in the semiconductor layer 102. In one embodiment, the doped region 112 may have a dopant concentration of about 5e11-9e13 atom/cm$^2$.

Figure 6:
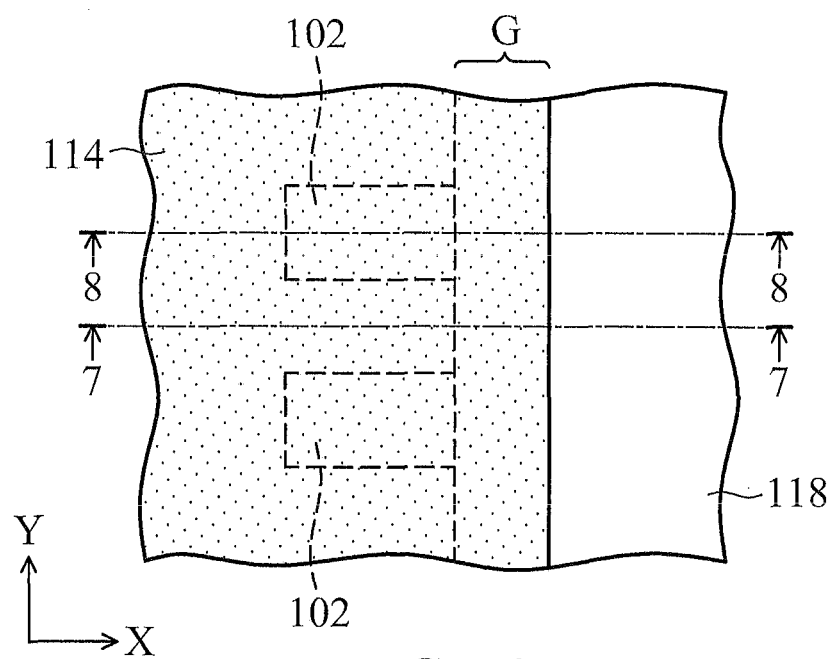
Figure 7:
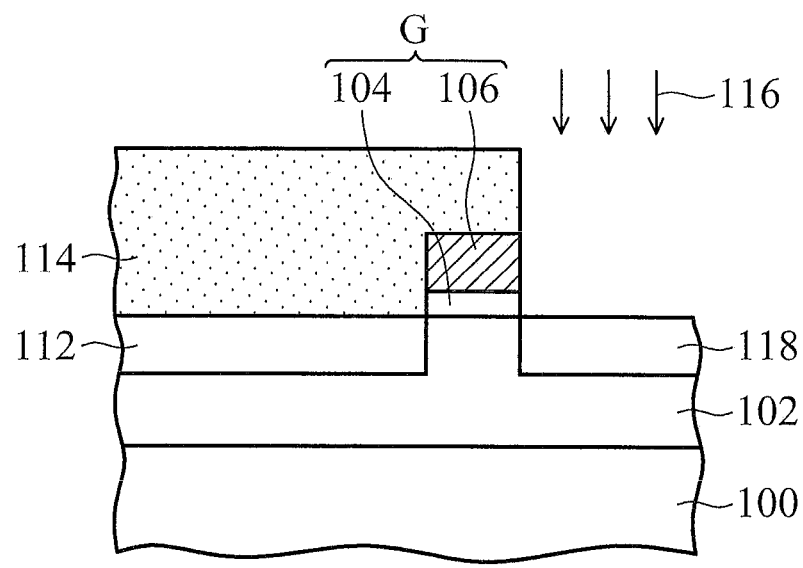
FIG. 7 is a schematic cross-sectional view showing a cross section along the line 7-7 in FIG. 6.
Figure 8:
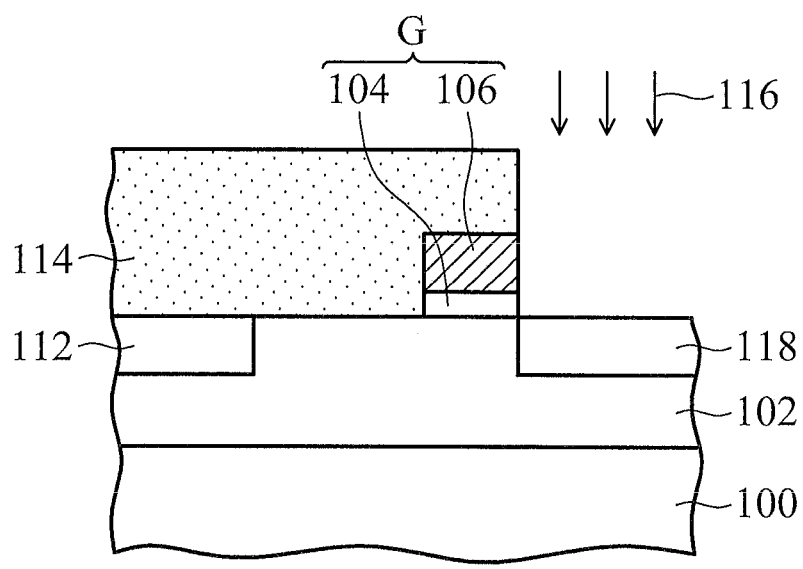
FIG. 8 is a schematic cross-sectional view showing a cross section along the line 8-8 in FIG. 6.

Referring to FIGS. 6-8, after removal of the patterned mask layer 108 shown in FIGS. 3-5, a patterned mask layer 114 is formed over the semiconductor layer 102, and an ion implant process 116 is performed to form a doped region 118 in a portion of the epitaxial semiconductor layer 102 at a side, for example the right side, of the gate structure G.

As shown in FIGS. 6-8, the patterned mask layer 114 covers the gate structure G and the portion of the semiconductor layer 102 adjacent to the left side the gate structure G. In one embodiment, the patterned mask layer 114 may comprise materials such as a photoresist, such that the patterned mask layer 114 can be patterned by, for example, photolithography and etching processes (both not shown).

In addition, in the ion implant process 116, dopants of a first conductivity type, for example P-type, are implanted into the portion of the semiconductor layer 102 exposed by the patterned mask layer 114, thereby forming a doped region 118 having the first conductivity type in the portion of the semiconductor layer 102. In one embodiment, the doped region 118 may have a dopant concentration of about 1E12 atom/cm$^2$ to about 5E14 atom/cm$^2$.

Figure 9:
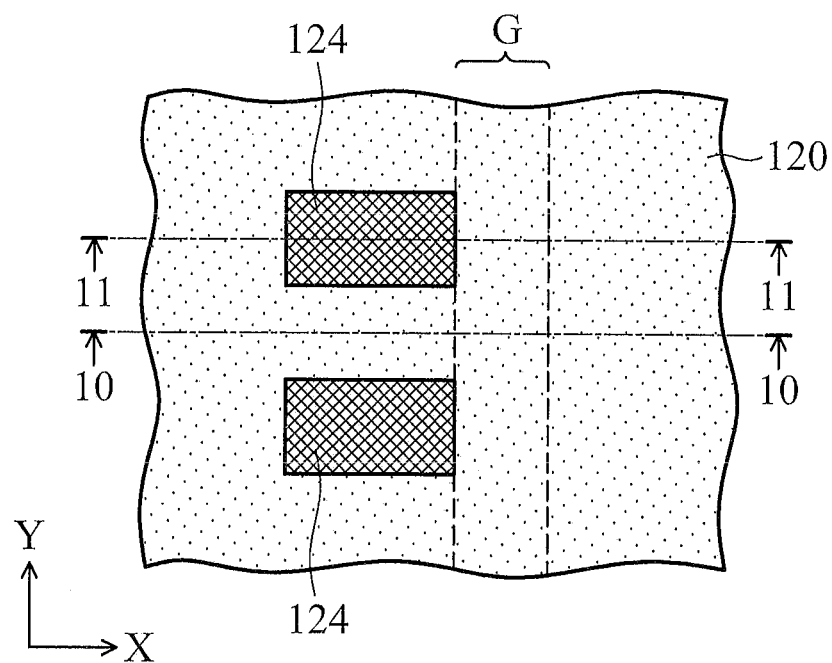
Figure 10:
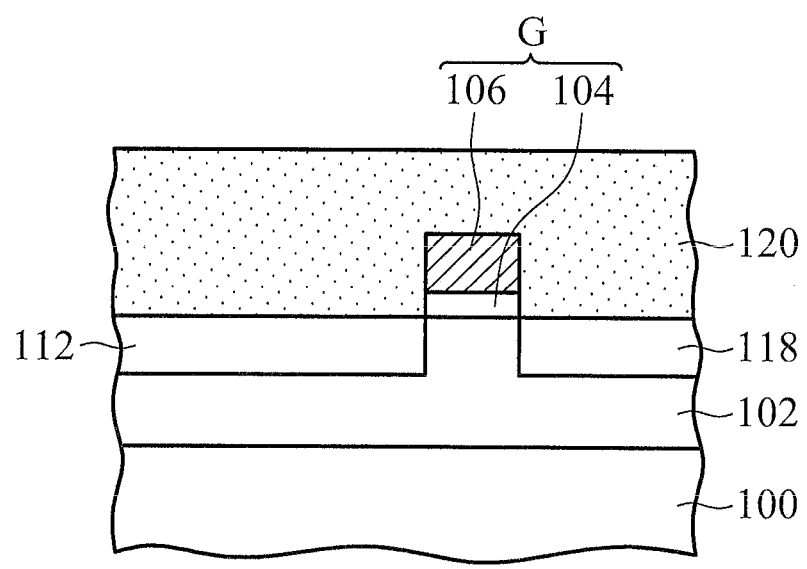
FIG. 10 is a schematic cross-sectional view showing a cross section along the line 10-10 in FIG. 8.
Figure 11:
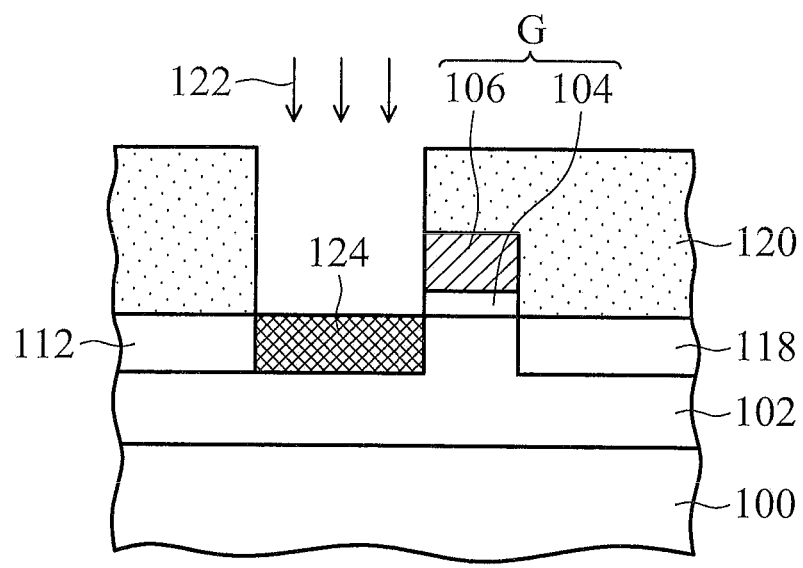
FIG. 11 is a schematic cross-sectional view showing a cross section along the line 11-11 in FIG. 8.

Referring to FIGS. 9-11, after removal of the patterned mask layer 114 shown in FIGS. 6-8, a patterned mask layer 120 is formed over the semiconductor layer 102, and an ion implantation process 122 is then performed to form a doped region 124 in the portions of semiconductor layer 202 at the left side of the gate structure G.

As shown in FIGS. 9-11, the patterned mask layer 120 covers the gate structure G, the doped region 112 and the doped region 118, and exposes the portions of the semiconductor layer 102 formed between the gate structure G and the doped region 112, such that the doped regions 124 are alternatively formed in portions of the semiconductor layer 102 adjacent to the left side the gate structure G and have a rectangular configuration, from a top view (see FIG. 9). In the ion implant process 122, dopants of a first conductivity type, for example P-type, are implanted into the portions of the semiconductor layer 102 exposed by the patterned mask layer 120, thereby forming the doped regions 124 having the first conductivity type in the portions of the semiconductor layer 102 at the left side of the gate structure G. In one embodiment, the doped region 124 may have a dopant concentration of about 5E11 atom/cm$^2$ to about 9E13 atom/cm$^2$.

Figure 12:
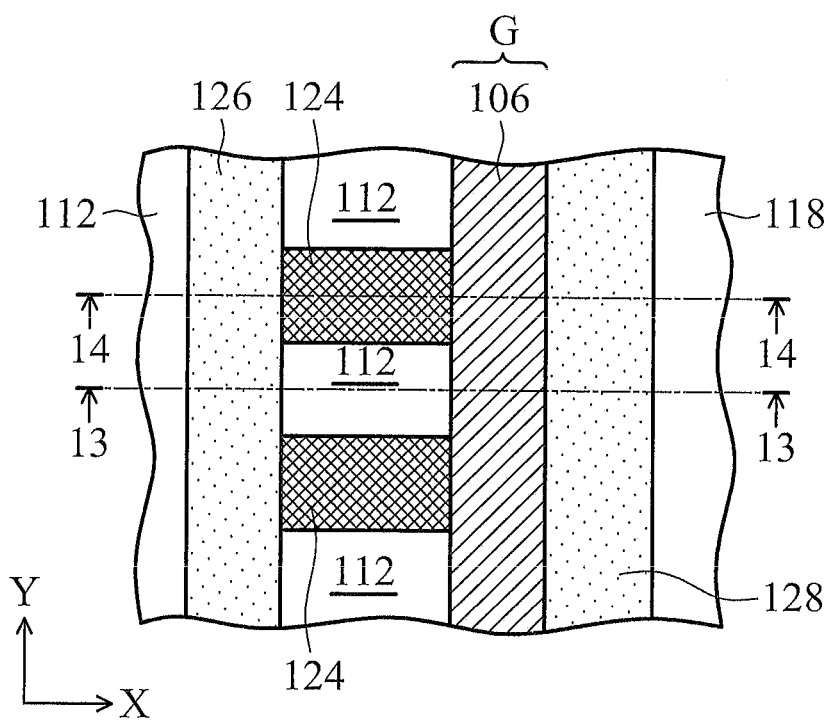
Figure 13:
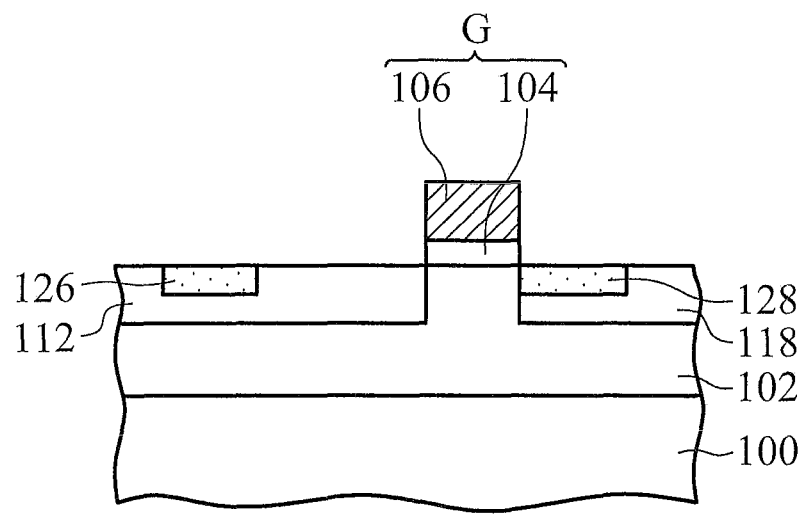
FIG. 13 is a schematic cross-sectional view showing a cross section along the line 13-13 in FIG. 12.
Figure 14:
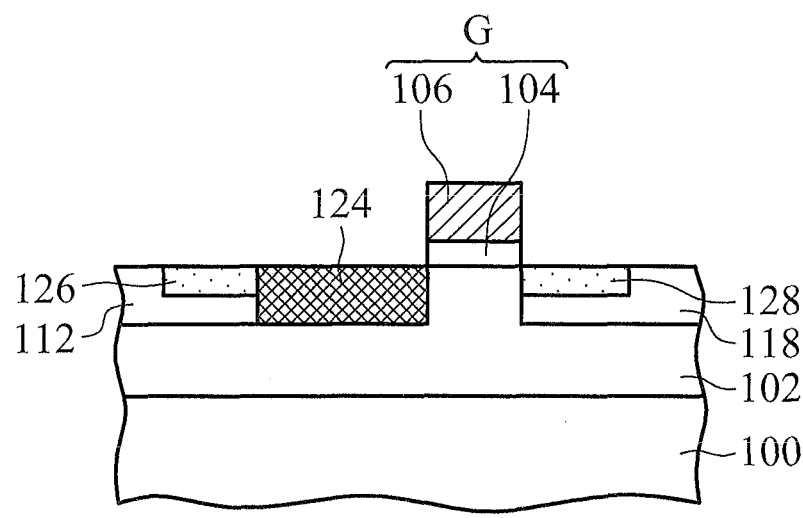
FIG. 14 is a schematic cross-sectional view showing a cross section along the line 14-14 in FIG. 12.

Referring to FIGS. 12-14, after removal of the patterned mask layer 120 shown in FIGS. 9-11, a patterned mask layer (not shown) is formed over the semiconductor substrate 102, and an ion implantation process (not shown) is then performed to form a doped region 126 and a doped region 128 in a portion of the doped regions 112 and 118 on opposite sides of the gate structure G, respectively. In one embodiment, the doped region 128 formed in a portion of the doped region 118 and the doped region 126 formed in a portion of the doped region 116, respectively, have the second conductivity type such as N type and a dopant concentration of about 1E14 atom/cm$^2$ to about 8E15 atom/cm$^2$, and the ion implantation process (not shown) for forming the doped regions 126 and 128 can be ion implantation which is vertical to a surface of the semiconductor layer 102. In one embodiment, the doped region 112 may function as a drift region, and the doped regions 128 and 126 may function as source and drain regions, respectively.

Moreover, the structure shown in FIGS. 12-14 may comprise a super-junction structure composed of the portion of the doped region 112 and the doped region 124 alternatively disposed over the semiconductor layer 102 along the Y direction. A width of the doped region 112 and a width of the doped region 124 in the super-junction structure along the Y direction can be the same or different. Similarly, a pitch between the doped regions 112 and a pitch of the doped regions 124 in the super-junction structure along the Y direction can be the same or different.

Figure 15:
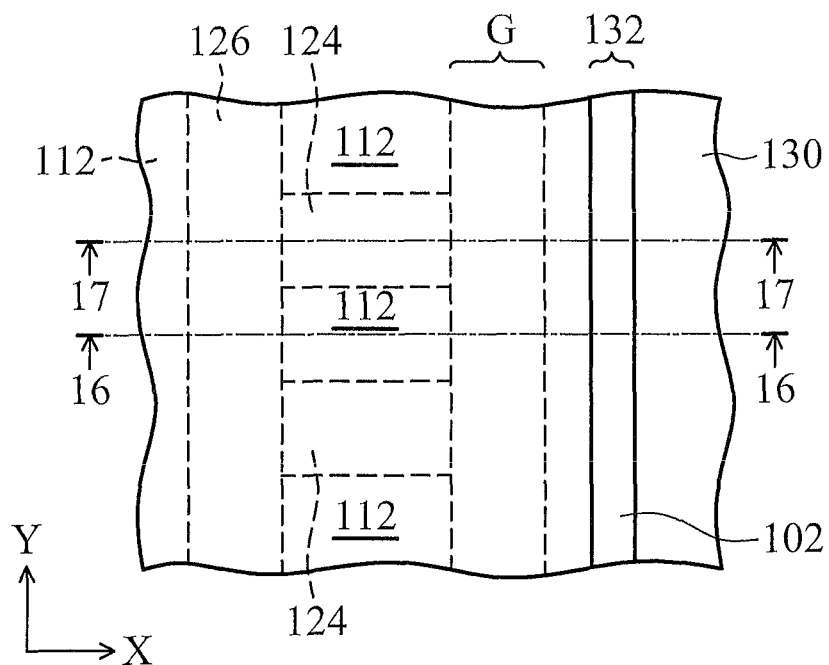
Figure 16:
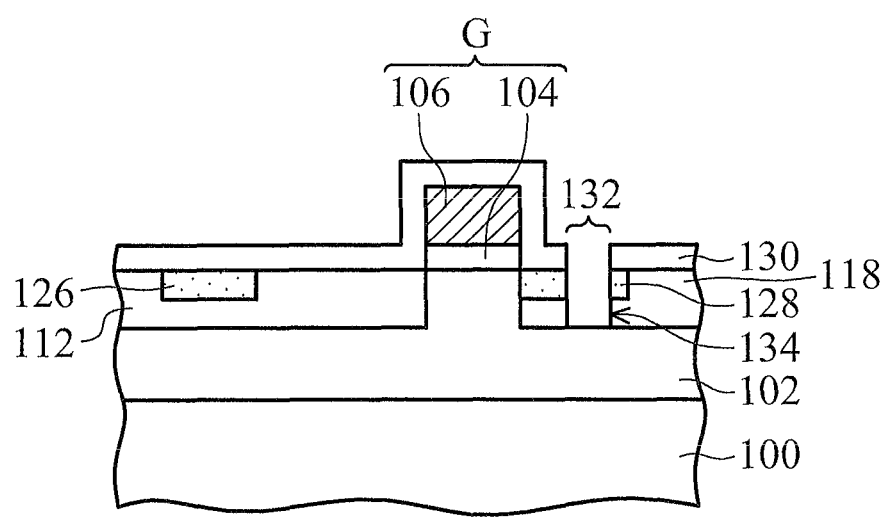
FIG. 16 is a schematic cross-sectional view showing a cross section along the line 16-16 in FIG. 15.
Figure 17:
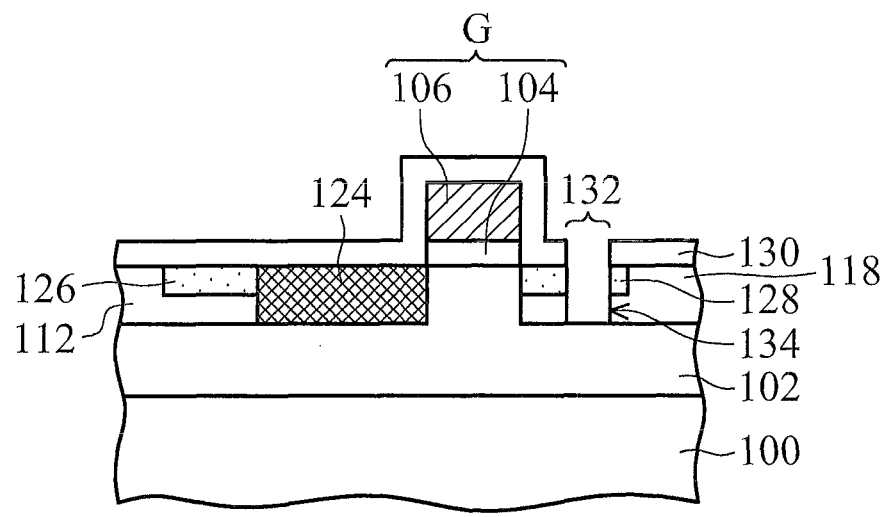
FIG. 17 is a schematic cross-sectional view showing a cross section along the line 17-17 in FIG. 15.

Referring to FIGS. 15-17, an insulating layer 130 is next formed over the semiconductor layer 102, conformably covering the top surface of the semiconductor layer 102 and a plurality of sidewalls and a top surface of the gate structure G. Next, a patterning process (not shown) is performed to form an opening 132 in a portion of the insulating layer 130. As shown in FIGS. 15-17, the opening 130 exposes a portion of the doped region 128 such that other portions of the semiconductor layer 102 and surfaces of the gate structure G are still covered by the insulating layer 130. In one embodiment, the insulating layer 130 may comprise insulating materials such as silicon oxide and silicon nitride, and can be formed by methods such as chemical vapor deposition. An etching process (not shown) is next performed, using the patterned insulating layer 130 with the opening 132 as an etching mask, thereby forming a trench 134 in the semiconductor layer 102 exposed by the opening 132. As shown in FIGS. 16-17, the trench 130 is formed with a depth which mainly penetrates the doped regions 128 and 118.

Figure 18:
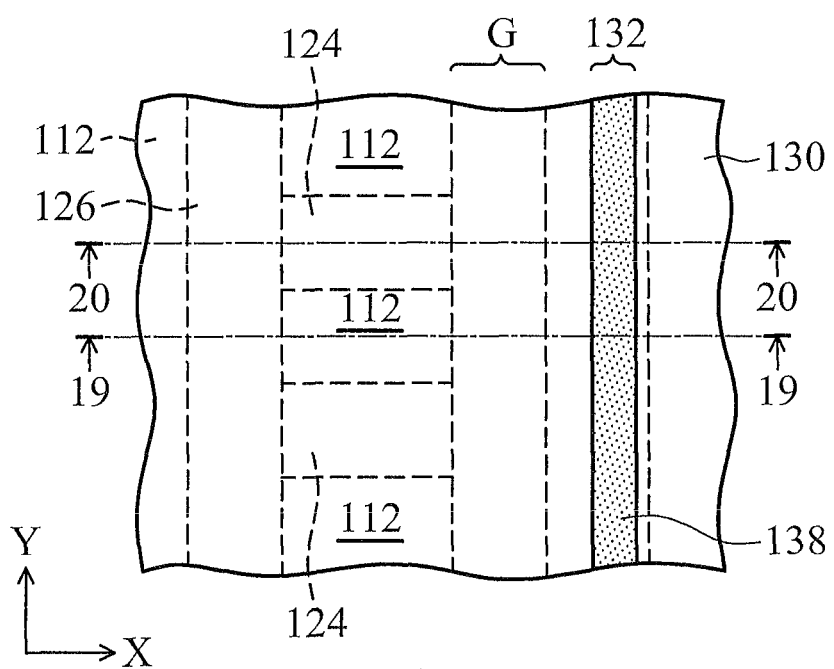
Figure 19:
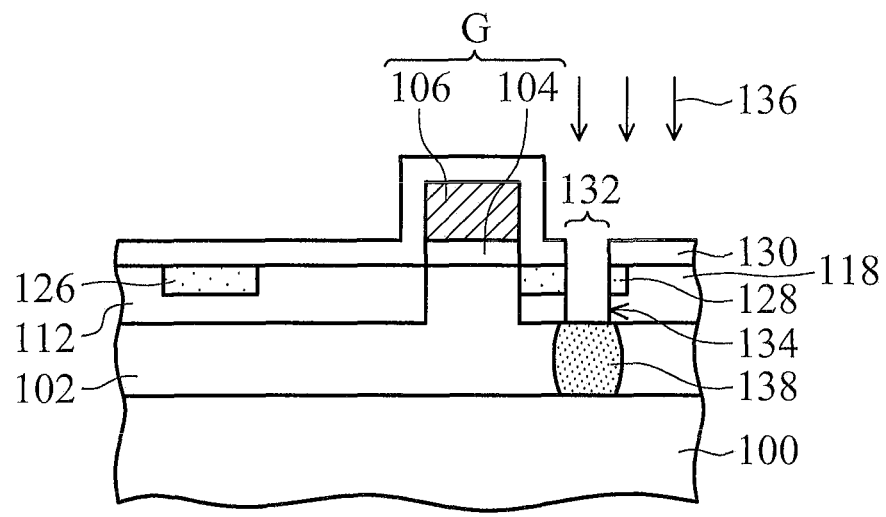
FIG. 19 is a schematic cross-sectional view showing a cross section along the line 19-19 in FIG. 18.
Figure 20:
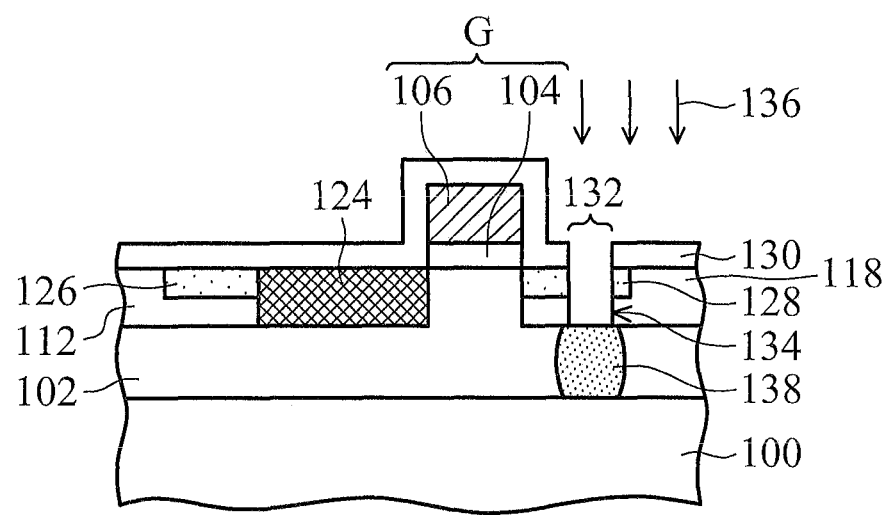
FIG. 20 is a schematic cross-sectional view showing a cross section along the line 20-20 in FIG. 18.

Referring to FIGS. 18-20, an ion implantation process 136 is performed, using the insulating layer 130 as an implantation mask, to implant dopants of the first conductivity type, for example P-type, to a portion of the semiconductor layer 102 exposed by the trench 134, thereby forming a doped region 138 in a portion of the semiconductor layer 102 between the doped region 118 and the semiconductor substrate 100. In one embodiment, the doped region 138 may have the first conductivity type, for example P-type, and have a dopant concentration of about 7E13 atom/cm$^2$ to about 9E15 atom/cm$^2$. In one embodiment, the dopant concentration in the doped region 138 may be greater than that in the semiconductor layer 102.

Figure 21:
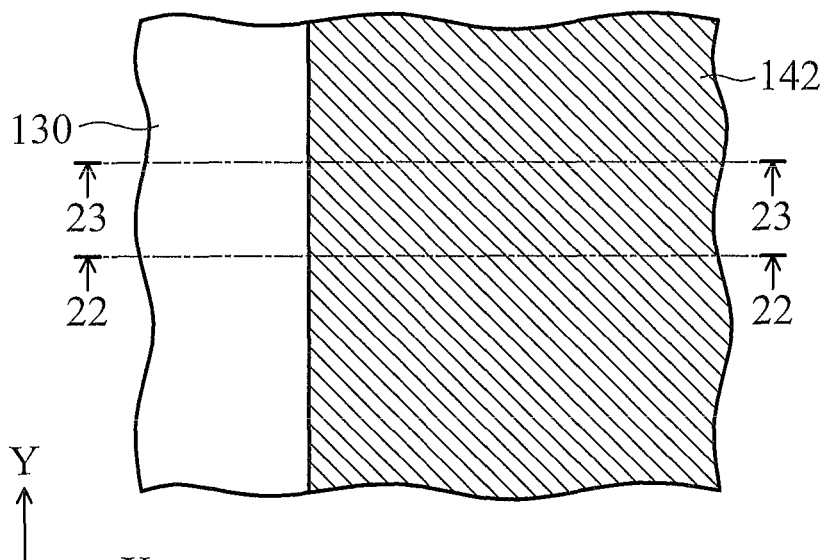
Figure 22:
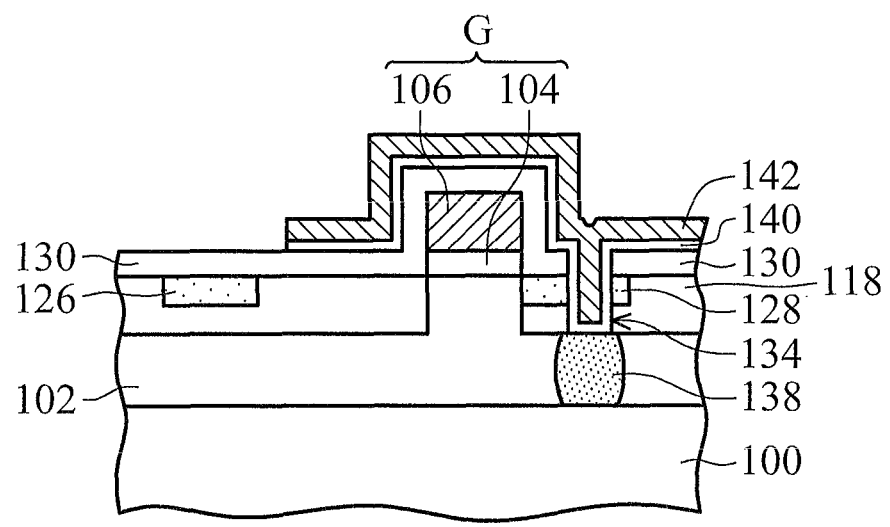
FIG. 22 is a schematic cross-sectional view showing a cross section along the line 22-22 in FIG. 21.
Figure 23:
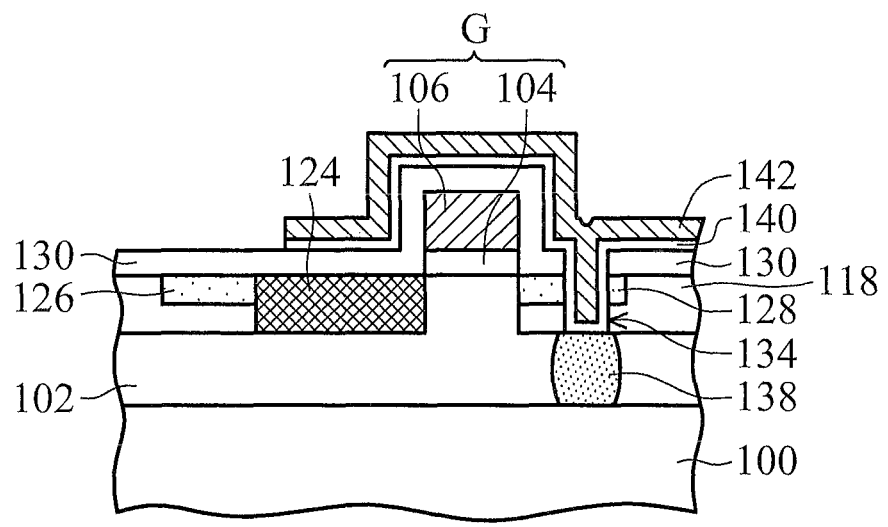
FIG. 23 is a schematic cross-sectional view showing a cross section along the line 23-23 in FIG. 21.

Referring to FIGS. 21-23, conductive materials are then deposited over the structure shown in FIGS. 18-20, and are patterned to form conductive layers 140 and 142. As shown in FIGS. 21-23, the conductive layer 140 is conformably formed over portions of the surface of the insulating layer 130, and the bottom surface and the sidewalls of the semiconductor layer 102 exposed by the trench 134. The conductive layer 142 is formed over the surface of the conductive layer 140 and fills the trench 134. As shown in FIGS. 22-23, the patterned conductive layers 140 and 142 are formed over the insulating layer 130 adjacent to the trench 134, extending over the bottom surface and the sidewalls of the trench 134, thereby covering surfaces of the semiconductor layer 102, and the doped regions 128 and 118 exposed by the trench 134, and the conductive layers 140 and 142 also cover the gate structure G and a portion of the doped region 112 adjacent to the gate structure G. However, the conductive layers 140 and 142 do not cover the doped region 126. The portion of the conductive layers 140 and 142 formed in the trench 134 may function as a conductive contact. At this time, the doped region 138 partially contacts with the bottom surface of the conductive layer 140 formed in the trench 134. In one embodiment, the conductive layer 140 may comprise conductive materials such as Ti—TiN alloy, and the conductive layer 142 may comprise conductive materials such as tungsten.

Figure 24:
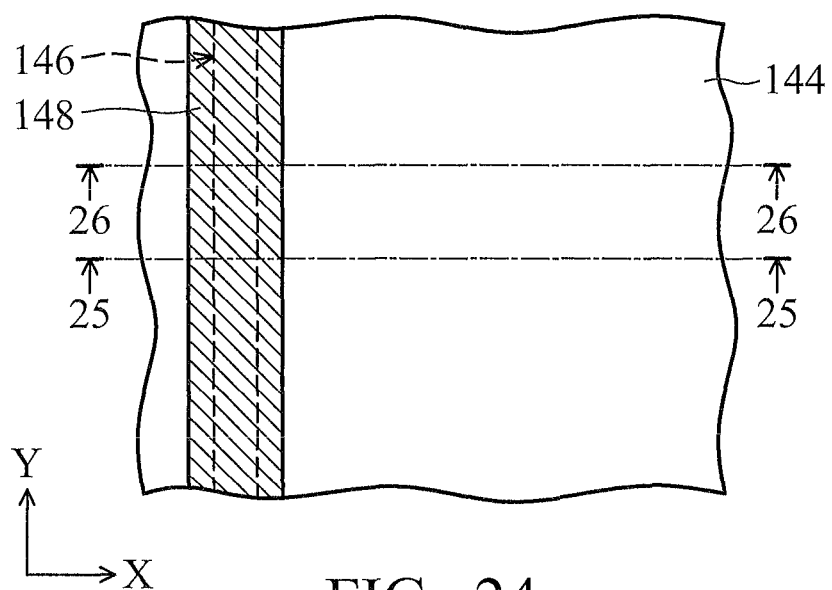
Figure 25:
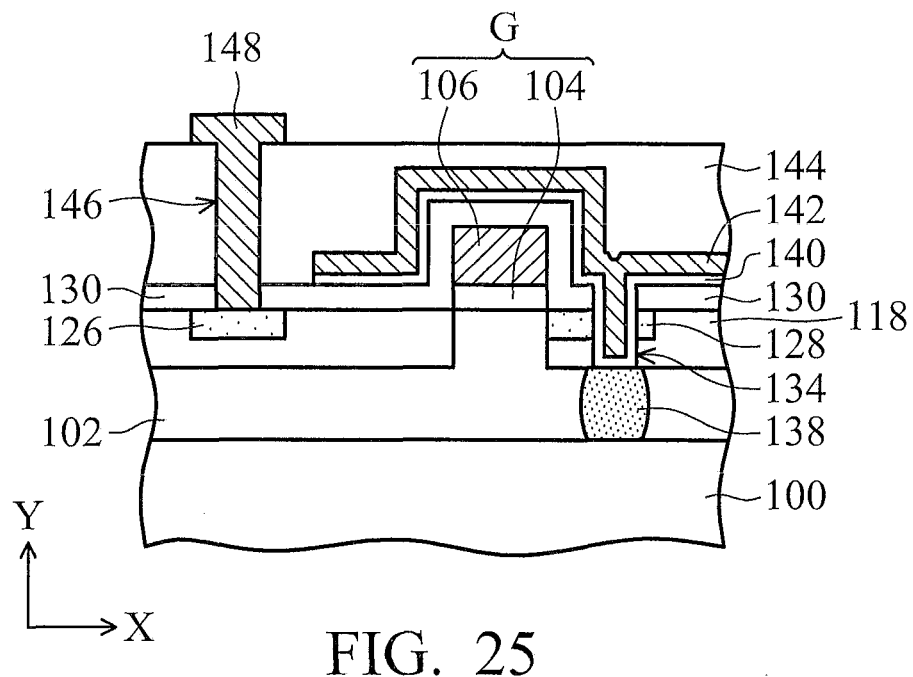
FIG. 25 is a schematic cross-sectional view showing a cross section along the line 25-25 in FIG. 24.
Figure 26:
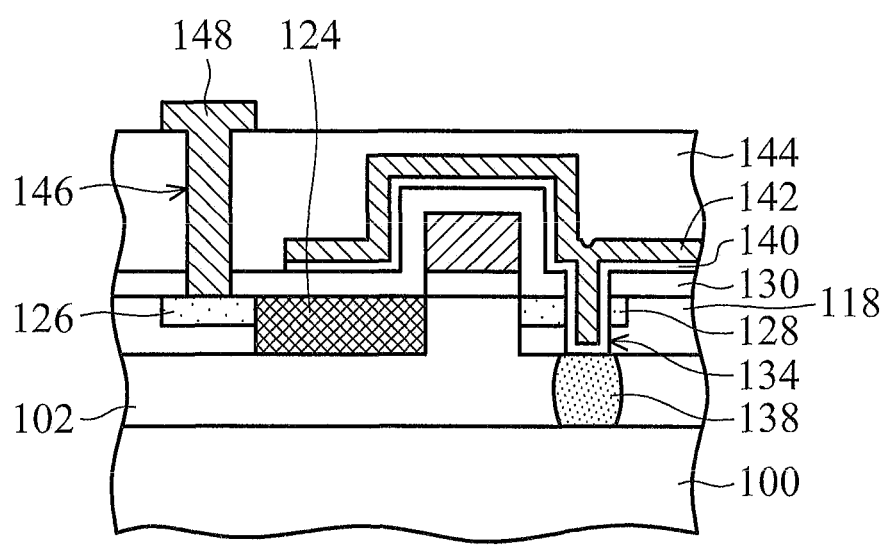
FIG. 26 is a schematic cross-sectional view showing a cross section along the line 26-26 in FIG. 24.

Referring to FIGS. 24-26, a dielectric material such as silicon oxide or spin-on-glass (SOG) is then deposited over the conductive layer 142 and the semiconductor layer 102, such that the dielectric material covers the conductive layer 142, the insulating layer 130, and the gate structure G, thereby forming an inter-layer dielectric (ILD) layer 144 with a substantially planar top surface. Next, a patterning process (not shown) comprising photolithography and etching steps is performed to form a trench 146 in a portion of the ILD layer 144 and the insulating layer 130 over a portion of the doped region 126, and the trench 146 exposes a portion of the doped region 126. Next, a conductive layer 148 is deposited over the ILD layer 144 and fills the trench 146, thereby contacting the doped region 126. The portion of the conductive layer 148 formed in the trench 146 may function as a conductive contact. In one embodiment, the conductive layer 146 may comprise conductive materials such as Ti—TiN alloy or tungsten. Therefore, an exemplary semiconductor device applicable for a lateral double diffused metal-oxide-semiconductor (LDMOS) device used as radio frequency (RF) circuit elements is substantially fabricated, as shown in FIGS. 24-26.

In one embodiment, the gate structure G and the doped regions 126 and 128 of the semiconductor device shown in FIGS. 25-26 may be properly electrically connected (not shown), and the regions with the first conductivity type can be P type regions, and the regions of the second conductivity type can be N type regions, such that the formed semiconductor device is an N type LDMOS device. At this time, the doped region 128 may function as a source region and the doped region 126 may function as a drain region.

In this embodiment, during the operation of the semiconductor device shown in FIGS. 24-26, currents from the drain side (e.g. the doped region 126) may laterally flow through a channel (not shown) under the gate stack G and toward the source side (e.g. doped region 128, and then arrive at the semiconductor substrate 100 by the guidance of the doped region 138, the conductive layers 140 and 142, and the doped region 118, such that the need for a source wire bond is eliminated and the semiconductor device can be provided with reduced thermal resistance.

In addition, in the semiconductor device shown in FIGS. 24-26, the doped regions 112 and 118 are formed after the gate structure G and a super-junction structure comprises alternating lateral p-n doped regions (see FIGS. 12-14). Thus, the semiconductor device may provide a low gate to drain capacitance, a low source to drain resistance (Ron) and sustain a high breakdown voltage.

Figure 27:
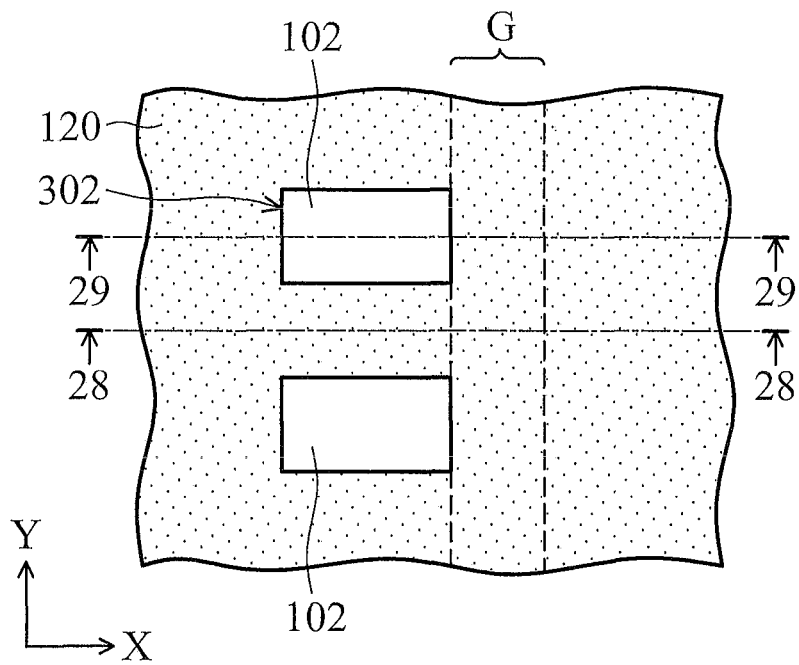
FIGS. 27, 30, and 33 are schematic top views showing a method for fabricating a semiconductor device according to an embodiment of the invention.
Figure 28:
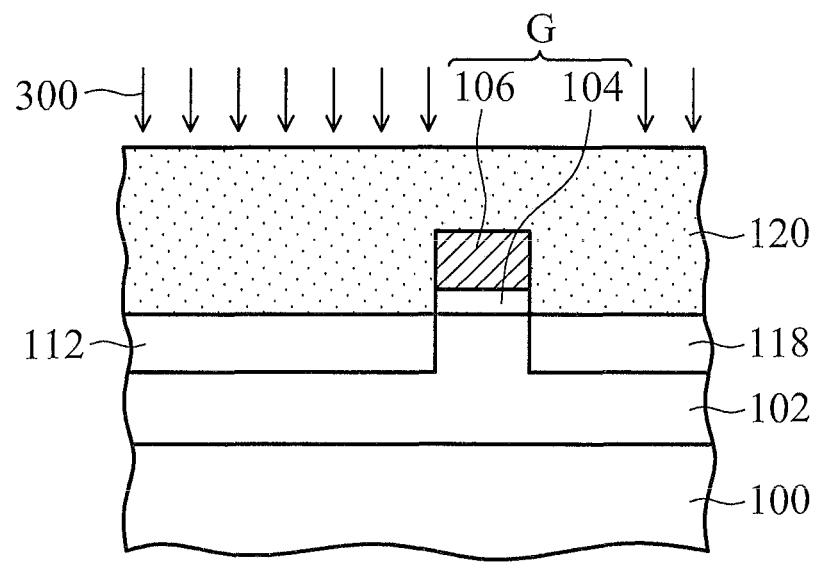
FIG. 28 is a schematic cross-sectional view showing a cross section along the line 28-28 in FIG. 27.
Figure 29:
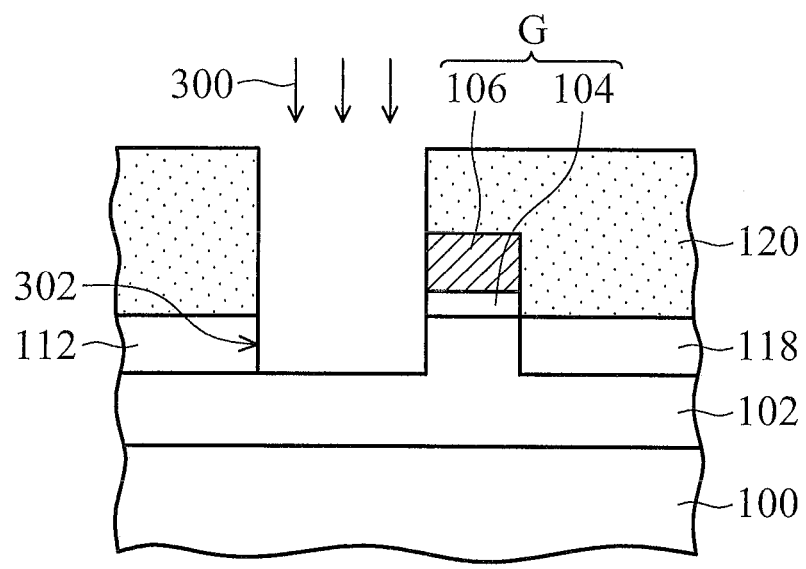
FIG. 29 is a schematic cross-sectional view showing a cross section along the line 29-29 in FIG. 27.
Figure 30:
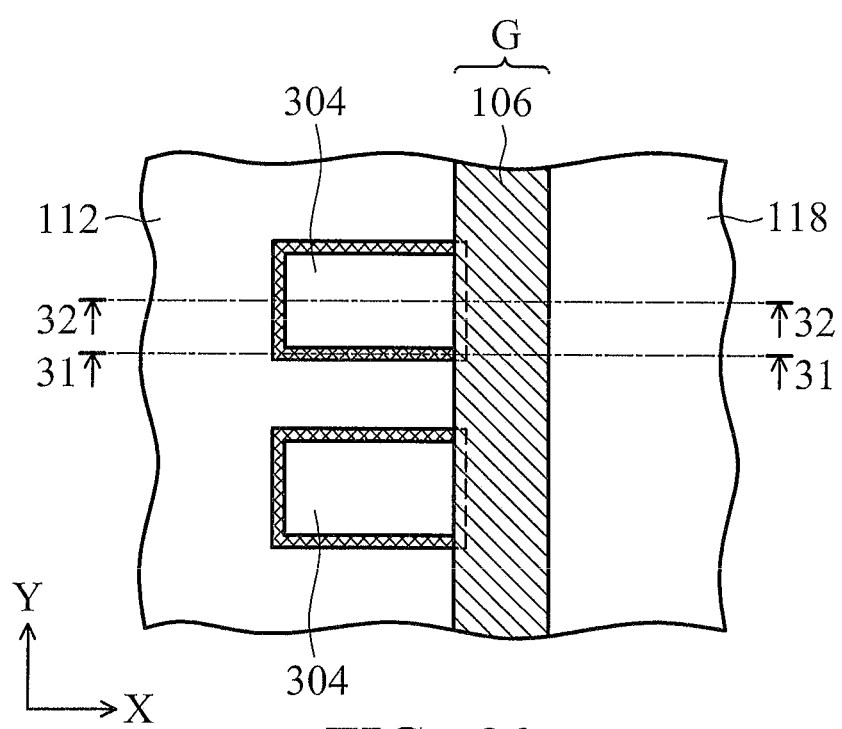
Figure 31:
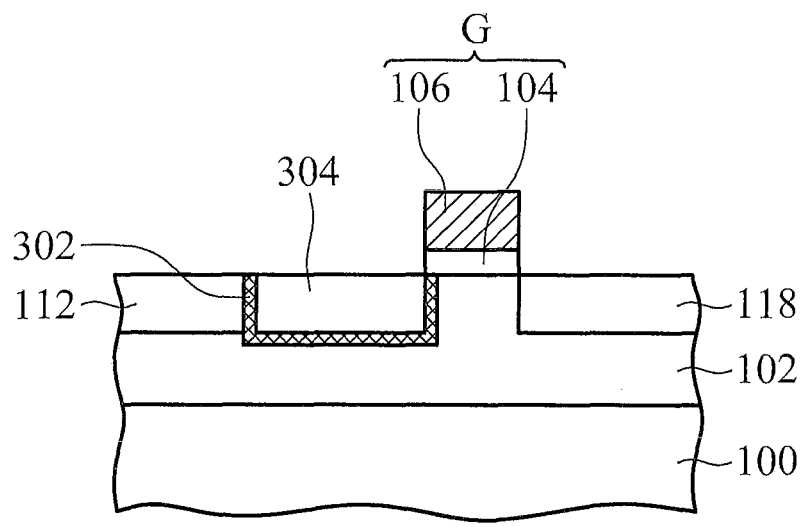
FIG. 31 is a schematic cross-sectional view showing a cross section along the line 31-31 in FIG. 30.
Figure 32:
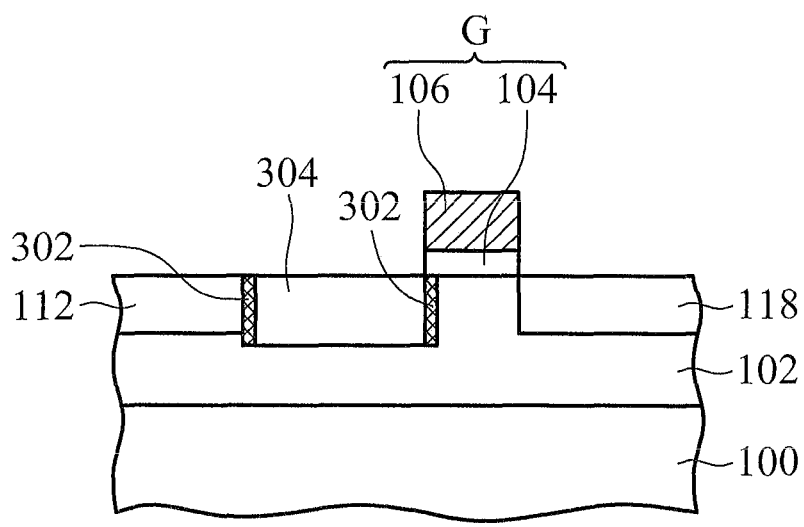
FIG. 32 is a schematic cross-sectional view showing a cross section along the line 32-32 in FIG. 30.
Figure 33:
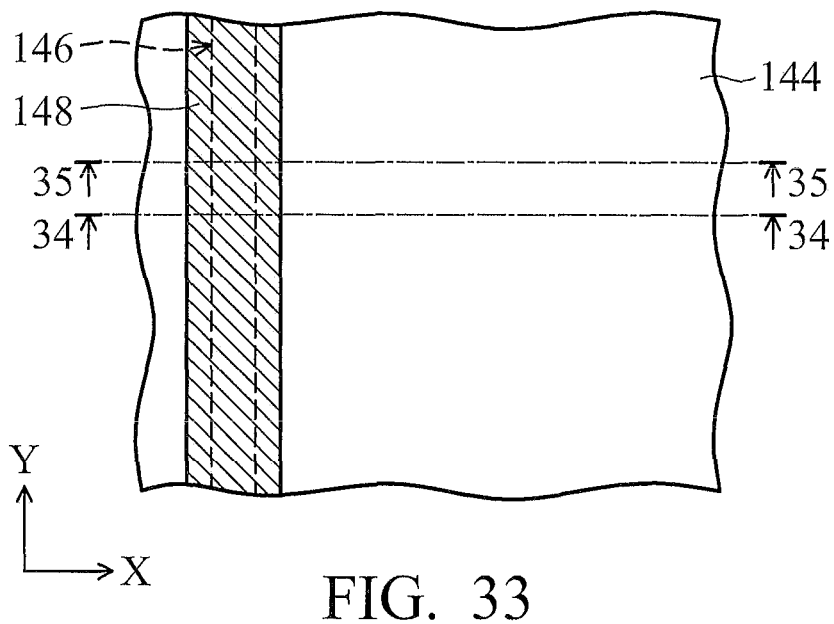

FIGS. 27-35 are schematic diagrams showing an exemplary method for fabricating a semiconductor device, wherein FIGS. 27, 30, and 33 are schematic top views, and FIGS. 28-29, 31-32, and 34-35 are schematic cross sectional views along lines 28-28, 29-29, 31-31, 32-32, 34-34, and 35-35 in FIGS. 27, 30, and 33, respectively, showing the intermediate fabrication steps in the method for fabricating the semiconductor device. The semiconductor device formed by the exemplary method shown in FIGS. 27-35 is applicable as a lateral double diffused metal-oxide-semiconductor (LDMOS) device used as radio frequency (RF) circuit elements.

Referring to FIGS. 27-29, the structure shown in FIGS. 6-8 is first provided and the processes related thereto are performed. Next, after removal of the patterned mask layer 114 shown in FIGS. 6-8, a pattern mask layer 120 which is the same with that shown in FIGS. 9-11 is formed over the semiconductor layer 102 and the gate structure G, and exposes the portions of the semiconductor layer 102 alternatively formed between the gate structure G and the doped region 112. Next, an etching process 300 is performed to remove the portions of the semiconductor layer 102 exposed by the patterned mask layer 120, thereby forming a plurality of trenches 302 in the doped region 112. The trenches 302 are formed with a strip-like pattern, from a top view, and expose a portion of the semiconductor layer 102, respectively.

Referring to FIGS. 30-32, an ion implantation process (not shown) is performed, using the patterned mask layer 120 shown in FIGS. 27-29 as an implant mask, to implant dopants of the first conductivity type, for example, p-type on sidewalls of the portions of the semiconductor layer 102 exposed by the trenches 302, thereby forming a doped region 302. Next, after removal of the patterned mask layer 120, an insulating material such as silicon oxide is formed to fill the trenches 302, thereby forming an insulating layer 304 in the trenches 302. The top surface of the insulating layer 304 is coplanar with that of the semiconductor layer 102 and the doped regions 112 formed therein. As shown in FIG. 30, the ion implantation process can be a tilt implantation process, such that the doped region 302 is formed with a hollow rectangular configuration, from a top view.

Figure 34:
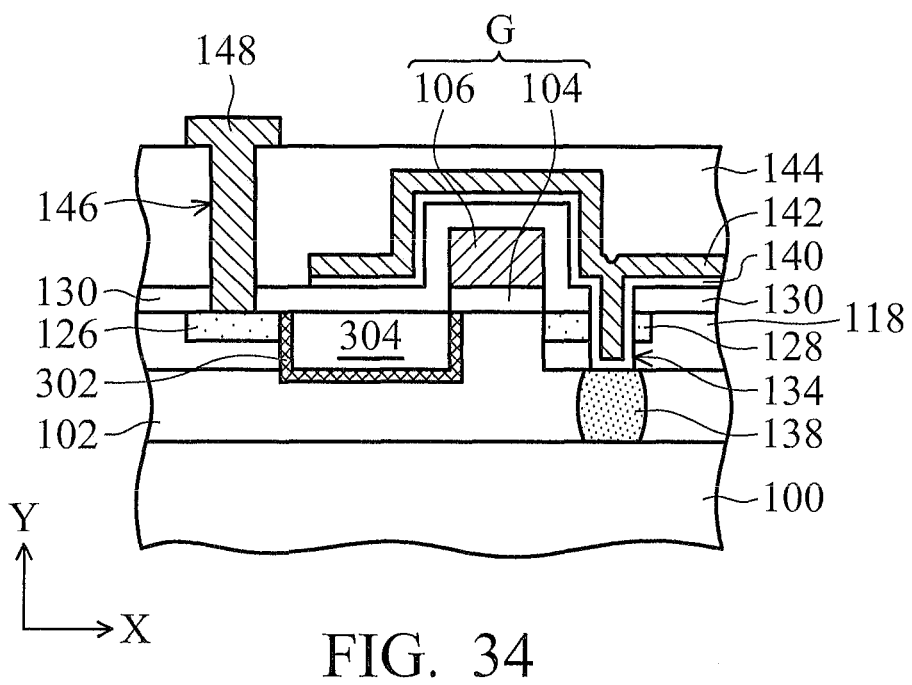
FIG. 34 is a schematic cross-sectional view showing a cross section along the line 34-34 in FIG. 33.
Figure 35:
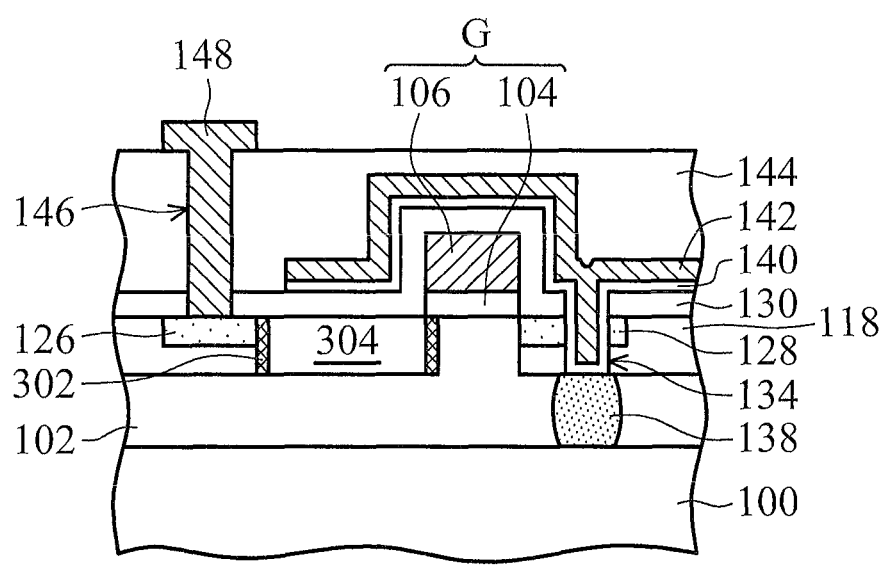
FIG. 35 is a schematic cross-sectional view showing a cross section along the line 35-35 in FIG. 33.

Referring to FIGS. 33-35, the processes shown in FIGS. 12-26 are then performed to the structure shown in FIGS. 30-33, thereby forming the semiconductor device shown in FIGS. 33-35.

In one embodiment, the gate structure G and the doped regions 126 and 128 of the semiconductor device shown in FIGS. 33-35 may be properly electrically connected (not shown), and the regions with the first conductivity type can be P type regions, and the regions of the second conductivity type can be N type regions, such that the formed semiconductor device is an N type LDMOS device. At this time, the doped region 128 may function as a source region and the doped region 126 may function as a drain region.

In this embodiment, during operation of the semiconductor device shown in FIGS. 33-35, currents from the drain side (e.g. the doped region 126) may laterally flow through a channel (not shown) under the gate stack G and toward the source side (e.g. doped region 128, and then arrive at the semiconductor substrate 100 by the guidance of the doped region 138, the conductive layers 140 and 142, and the doped region 118, such that the need for a source wire bond is eliminated and the semiconductor device can be provided with reduced thermal resistance.

In addition, in the semiconductor device shown in FIGS. 33-35, the doped regions 112 and 118 are formed after the gate structure G and a super-junction structure comprises alternating lateral p-n doped regions (see FIGS. 30-32). Thus, the semiconductor device may provide a low gate to drain capacitance, a low source to drain resistance (Ron) and sustain a high breakdown voltage.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate, having a first conductivity type;
a semiconductor layer formed over the semiconductor substrate, having the first conductivity type;
a gate structure disposed over a portion of the semiconductor layer;
a first doped region disposed in a portion of the semiconductor layer adjacent to a first side of the gate structure, having the first conductivity type;
a second doped region disposed in a portion of the semiconductor layer adjacent to a second side of the gate structure opposite to the first side, having a second conductivity type opposite to the first conductivity type;
a third doped region disposed in a portion of the first doped region, having the second conductivity type;
a fourth doped region disposed in a portion of the second doped region, having the second conductivity type;
a plurality of fifth doped regions, separately disposed in a plurality portions of the second doped region, having the first conductivity type, wherein the fifth doped regions are formed between the fourth doped region and the gate structure and the fifth doped regions physically contact the fourth doped region;
a sixth doped region disposed in a portion of the semiconductor layer under the first doped region, contacting the semiconductor substrate; and
a conductive contact formed in a portion of the third doped region and the first doped region, contacting the sixth doped region,
wherein the conductive contact does not extend into the sixth doped region.

2. The semiconductor device as claimed in claim 1, wherein the first conductivity type is P type and the second conductivity type is N type.

3. The semiconductor device as claimed in claim 1, wherein the third doped region is a source region, and the fourth doped region is a drain region.

4. The semiconductor device as claimed in claim 1, wherein the fifth doped regions and the second doped region adjacent thereto form a super-junction structure.

5. The semiconductor device as claimed in claim 1, wherein the fifth doped regions are formed with a rectangular configuration from a top view.

6. The semiconductor device as claimed in claim 1, wherein the fifth doped regions are formed with a hollow-rectangular configuration from a top view.

7. The semiconductor device as claimed in claim 6, further comprising an insulating layer formed in a plurality of portions of the semiconductor layer, wherein the insulating layer is surrounded by each of the fifth doped regions, respectively.

8. The semiconductor device as claimed in claim 1, wherein the conductive contact comprises a first conductive layer, and a second conductive layer is surrounded by the first conductive layer.

9. A method for fabricating a semiconductor device, comprising:
providing a semiconductor substrate, having a first conductivity type;
forming a semiconductor layer over the semiconductor substrate, having the first conductivity type;
forming a gate structure over a portion of the semiconductor layer;
forming a first doped region in a portion of the semiconductor layer adjacent to a first side of the gate structure, having the first conductivity type;
forming a second doped region in a portion of the semiconductor layer adjacent to a second side of the gate structure opposite to the first side, having a second conductivity type opposite to the first conductivity type;
forming a third doped region in a portion of the first doped region, having the second conductivity type;
forming a fourth doped region in a portion of the second doped region, having the second conductivity type opposite to the first conductivity type;
forming a plurality of fifth doped regions in a plurality portions of the second doped region, having the first conductivity type, wherein the fifth doped regions are formed between the fourth doped region and the gate structure and the fifth doped regions physically contact the fourth doped region;
forming an insulating layer over the second doped region, the gate structure, and a portion of the third doped region;
forming a trench in a portion of the third doped region and the first doped region, exposing a portion of the semiconductor layer under the first doped region;
performing an ion implantation process, implanting dopants of the first conductive type in the semiconductor layer exposed by the trench, thereby forming a sixth doped region, wherein the sixth doping region physically contacts with the semiconductor substrate; and
forming a conductive contact in the trench, wherein the conductive contact physically contacts with the sixth doped region and does not extend into the sixth doped region.

10. The method as claimed in claim 9, wherein the first conductivity type is P type and the second conductivity type is N type.

11. The method as claimed in claim 9, wherein the third doped region is a source region and the fourth doped region is a drain region.

12. The method as claimed in claim 9, wherein the fifth doped regions and the second doped region adjacent thereto form a super junction structure.

13. The method as claimed in claim 9, wherein the fifth doped regions are formed with a rectangular configuration from a top view.

14. The method as claimed in claim 9, wherein the fifth doped regions are formed with a hollow-rectangular configuration from a top view.

15. The method as claimed in claim 9, further comprising forming an insulating layer in a plurality of portions of the semiconductor layer, wherein the insulating layer is surrounded by each of the fifth doped regions, respectively.

16. The method as claimed in claim 9, wherein the conductive contact comprises a first conductive layer, and a second conductive layer is surrounded by the first conductive layer.

* * * * *